United States Patent
de Rooij (10) Patent No.: US 12,463,638 B2
(45) Date of Patent: Nov. 4, 2025

(54) DRIVER CIRCUIT FOR GAN FET SOLID STATE RELAY

(71) Applicant: Efficient Power Conversion Corporation, El Segundo, CA (US)

(72) Inventor: Michael A. de Rooij, Playa Vista, CA (US)

(73) Assignee: Efficient Power Conversion Corporation, El Segundo, CA (US)

(*) Notice: Subject to any disclaimer, the term of this patent is extended or adjusted under 35 U.S.C. 154(b) by 42 days.

(21) Appl. No.: 18/363,996

(22) Filed: Aug. 2, 2023

(65) Prior Publication Data

US 2024/0048142 A1 Feb. 8, 2024

Related U.S. Application Data

(60) Provisional application No. 63/482,837, filed on Feb. 2, 2023, provisional application No. 63/395,080, filed on Aug. 4, 2022.

(51) Int. Cl.
| | |
|---|---|
| *H03K 17/68* | (2006.01) |
| *H03K 17/041* | (2006.01) |
| *H03K 17/06* | (2006.01) |
| *H03K 17/687* | (2006.01) |

(52) U.S. Cl.
CPC ... *H03K 17/6871* (2013.01); *H03K 17/04106* (2013.01); *H03K 17/063* (2013.01)

(58) Field of Classification Search
CPC ......... H03K 17/6871; H03K 17/04106; H03K 17/063
See application file for complete search history.

(56) References Cited

U.S. PATENT DOCUMENTS

| | | | | |
|---|---|---|---|---|
| 2013/0321038 A1* | 12/2013 | Zhao | ............... | H03K 17/063 327/109 |
| 2014/0027785 A1* | 1/2014 | Rose | ............... | H03K 17/08122 257/77 |
| 2016/0094218 A1* | 3/2016 | van Otten | ............... | H03K 17/6871 327/427 |
| 2023/0043943 A1* | 2/2023 | Errico | ............... | H03K 17/162 |

OTHER PUBLICATIONS

Zhou et al, "A Gate Driver with a Negative Turn Off Bias Voltage for GaN HEMTs", 2020, IEEE, all pages (Year: 2020).*

* cited by examiner

*Primary Examiner* — Daniel C Puentes
(74) *Attorney, Agent, or Firm* — Blank Rome LLP (57) ABSTRACT

A driver circuit for a solid-state relay which includes a split power supply. The positive supply of the split power supply provides a voltage for application to the gate of a power FET for supplying power to a load. The negative supply of the split power supply provides a negative voltage for turning off a control transistor. The control transistor prevents the power FET from conducting power to the load when the driver circuit is turned off. The circuit is particularly adapted for driving a power GaN FET solid state relay. The circuit is provided in a cascaded embodiment to increase the blocking voltage of the solid-state relay.

20 Claims, 8 Drawing Sheets

DRIVER CIRCUIT FOR GAN FET SOLID STATE RELAY

CROSS-REFERENCE TO RELATED APPLICATION

This application claims the benefit of U.S. Provisional Application No. 63/395,080, filed Aug. 4, 2022, and U.S. Provisional Application No. 63/482,837, filed Feb. 2, 2023, the disclosures of which are incorporated by reference herein in their entireties

BACKGROUND OF THE INVENTION

A solid state relay (SSR) is an electronic switching device that switches on or off when an external voltage (AC or DC) is applied across its control terminals. SSRs serve the same function as an electromechanical relay, but since they have no moving parts, they are faster and have a longer operational lifetime.

SSRs consist of a sensor which responds to an appropriate input (i.e., a control signal), an electronic switching device which switches power to the load circuitry, and a circuit to enable the control signal to activate the electronic switch without mechanical parts. SSRs may be designed to switch either AC or DC loads. Packaged SSRs use power semiconductor devices, such as MOSFETs, to switch currents up to around a hundred amperes.

An SSR based on a single MOSFET, or multiple MOSFETs in a paralleled array, can work well for DC loads. MOSFETs have an intrinsic diode in anti-parallel to the control device that conducts in the reverse direction when the MOSFET is in the off state, so a single MOSFET cannot block voltage in both directions. For AC (bi-directional) operation, two MOSFETs can be arranged back-to-back with their source pins tied together, and the drain pins connected to either side of the designated switch terminals. The intrinsic anti-parallel diodes are alternately reverse-connected to block current when the relay is off. When the relay is on, the common source is always riding on the instantaneous signal level, and both gates are biased positive relative to the source by the isolated gate driver.

Figure 1:
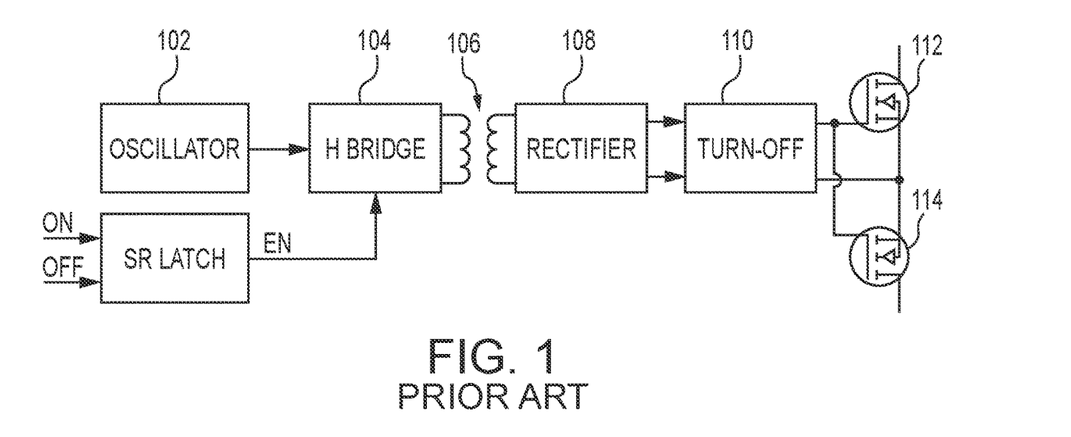
FIG. 1 is a block diagram of the typical circuitry in an SSR for controlling back-to-back MOSFETs.

FIG. 1 shows a block diagram of the typical circuitry in an SSR for controlling back-to-back MOSFETs 112 and 114. For turn-on, oscillator 102 and H bridge (or half bridge) 104 provide an approximately 300 kHz square wave to transformer 106. The 5V signal from transformer 106 is rectified (rectifier 108) and processed by gate driver circuitry 110 to control the gates of MOSFETs 112 and 114.

Figure 2:
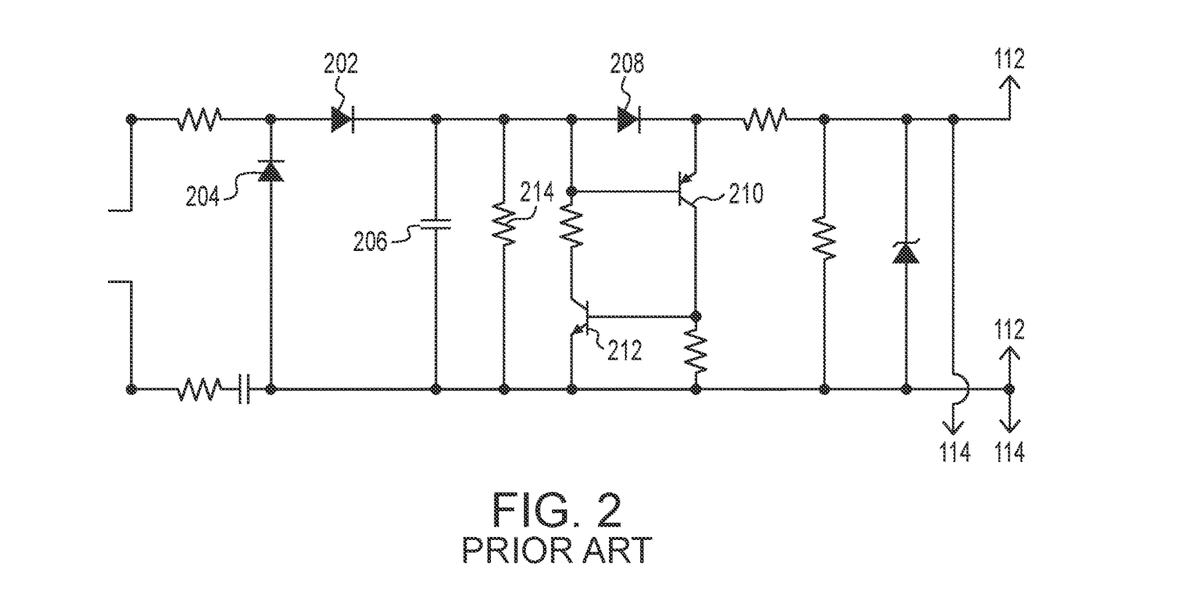
FIG. 2 is a circuit diagram showing details of certain circuitry of FIG. 1.

FIG. 2 is a circuit diagram showing the details of the rectifier 108 and the gate driver circuitry 110 of FIG. 1. Diodes 202 and 204 form a voltage-doubler rectifier to yield a 10V signal. When capacitor 206 is charged, diode 208 conducts, transistor 210 is forced off, which keeps transistor 212 off. When diode 208 conducts, power FETs 112 and 114 are turned on.

For turn off, oscillator 102 is turned off and there is no power in transformer. Capacitor 206 discharges through resistor 214, and diode 208 stops conducting. As capacitor 206 discharges, transistor 210 turns on and, if there is gate voltage on power FETs 112 and 114, then transistor 212 will turn on, forcing a discharge of the gate.

The rectifier and turn off circuit shown in FIG. 2 and described above cannot be used for controlling GaN transistors (in place of MOSFETs). MOSFET transistors 210 and 212 stop conducting at approximately 1V gate voltage. A GaN FET can still conduct at this low gate voltage. Accordingly, a circuit is needed that turns the gate of a GaN FET fully off.

SUMMARY OF THE INVENTION

The present invention overcomes the disadvantages of the prior art noted above. Specifically, the present invention provides a driver circuit for a solid state relay which includes a split power supply. The positive supply of the split power supply provides a voltage for application to the gate of a FET 304 for supplying power to a load. The negative supply of the split power supply provides a negative voltage for turning off a control transistor 306. The control transistor prevents the FET from conducting power to the load when the driver circuit is turned off. The driver circuit is provided in a cascaded embodiment to increase the blocking voltage of the solid-state relay.

The driver circuit of the present invention advantageously provides a simple, low cost solution for driving a power GaN FET in a solid state relay application.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

The advantages and features of the present invention will become apparent when the following description of the preferred embodiments of the invention is read in conjunction with the accompanying drawings, in which.

DETAILED DESCRIPTION OF THE PREFERRED EMBODIMENTS

It is to be understood that the figures and descriptions of the present invention may have been simplified to illustrate only elements that are relevant for a clear understanding of the present embodiments. Those of ordinary skill in the art will recognize that other elements may be desirable and/or required in order to implement the present embodiments. It is also to be understood that the drawings included herewith only provide diagrammatic representations of the presently preferred embodiments of the present invention. Reference will now be made to the drawings wherein like structures are provided with like reference designations (including, for example, turn-on oscillators 102, 502; transformers 106, 506; control transistors 306, 606, 706; diodes 308, 608, 708; capacitors 310, 610, 710; diode 312, 612, 712; capacitor 314, 614, 714; resistors 316, 616, 716; diodes 620, 720; diodes 626, 726; diodes 628, 728; resistors 624, 724; and diodes 622, 722).

Figure 3:
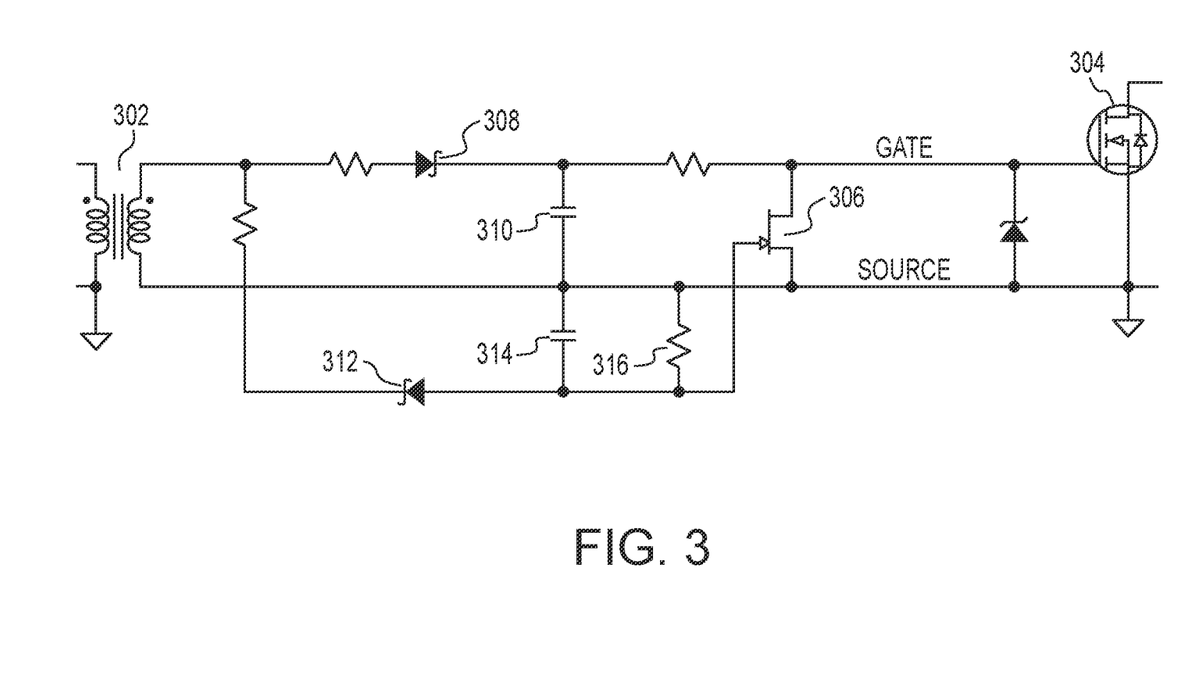
FIG. 3 is a circuit diagram of the drive circuit for the solid-state relay of the present invention.

FIG. 3 shows the driver circuit for the solid-state relay of the present invention. The driver circuit of the present invention can control either MOSFETs or GaN FETs, but is particularly adapted for controlling GaN FETs. GaN FETs require only 5V to control the gate. The present invention uses a single transformer 302 to yield a split voltage of +5V and −5V. The +5V output of transformer 302 is used to turn on the gate of main FET 304, which switches power to the load circuitry. FET 304 is a GaN FET in the preferred embodiment of the present invention. The −5V output of the transformer is used to turn off a control transistor 306, removing the clamping function of transistor 306 and allowing the voltage across capacitor 310 to pass to the gate of the GaN FET 304 to turn it on. The control transistor 306 may be a JFET (as shown in FIG. 3) or a depletion mode GaN FET.

For turn on, transformer 302 operates with an approximately 300 kHz square wave. Diode 308 rectifies the square wave to positively charge capacitor 310, while diode 312 rectifies the square wave to negatively charge capacitor 314. When capacitor 314 is charged, JFET 306 turns off, allowing the voltage stored on capacitor 310 to appear on the gate of GaN FET 304.

For turn-off, the oscillator 302 is turned off and no power is transmitted by transformer 302. Capacitor 314 discharges through resistor 316. When capacitor 314 discharges below −1V, JFET 306 turns on and discharges the gate of GaN FET 304. Thus, JFET 306 always holds the gate of GaN FET 304 off when the oscillator is off.

Figure 4:
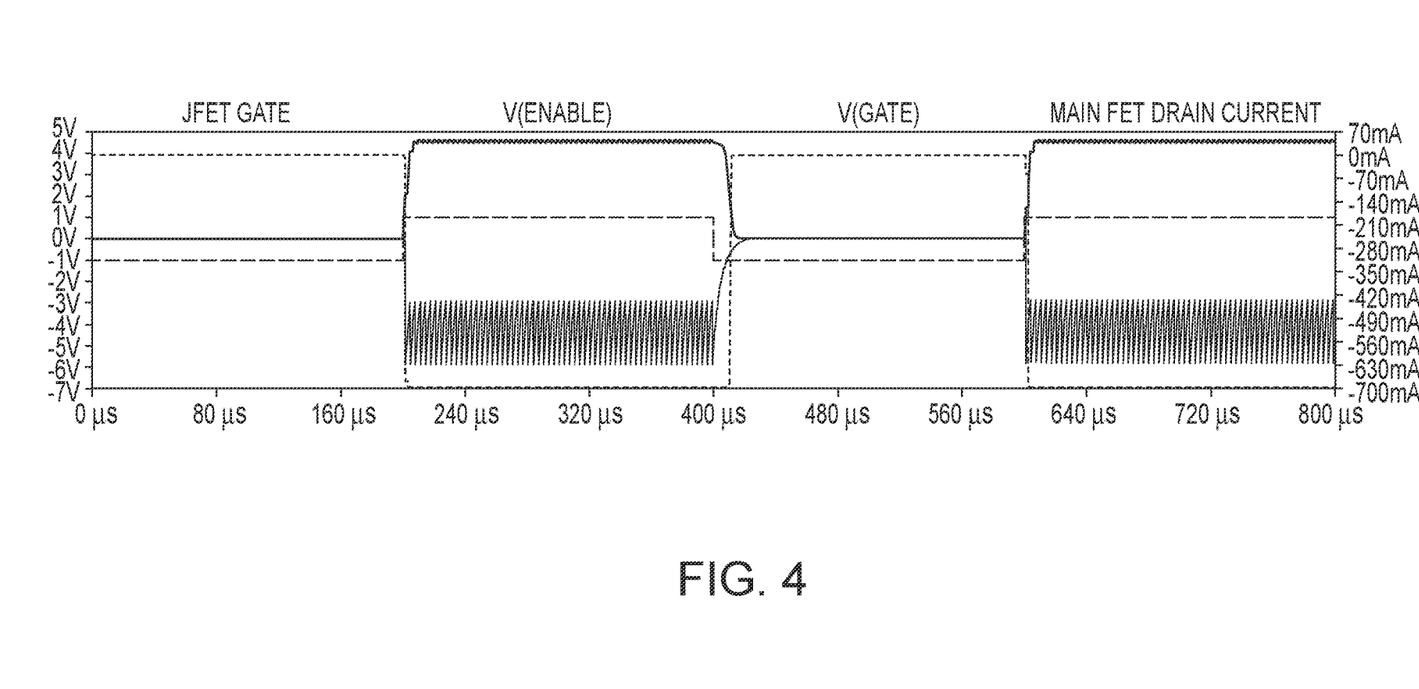
FIG. 4 is a waveform diagram showing the power FET conducting current.

FIG. 4 is a waveform diagram showing the GaN FET 304 conducting DC current. V(enable) is the control signal turning the oscillator on and off. V(gate) is the voltage to the gate of GaN FET 304. The driver circuit initiates voltage for the negative side first, prioritizing the turn off of the JFET 306, thus reducing turn-on current.

Figure 5:
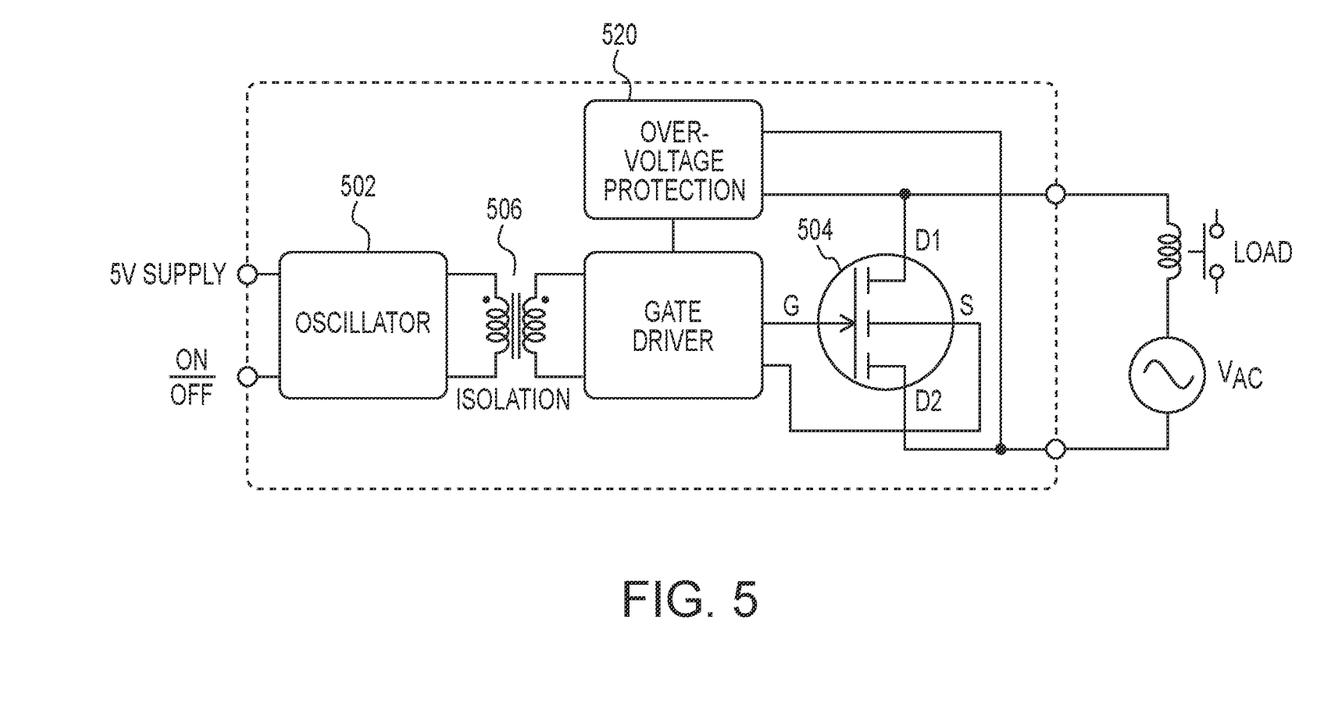
FIG. 5 is a block diagram of the single gate driver of the present invention capable of AC operation.
Figure 6:
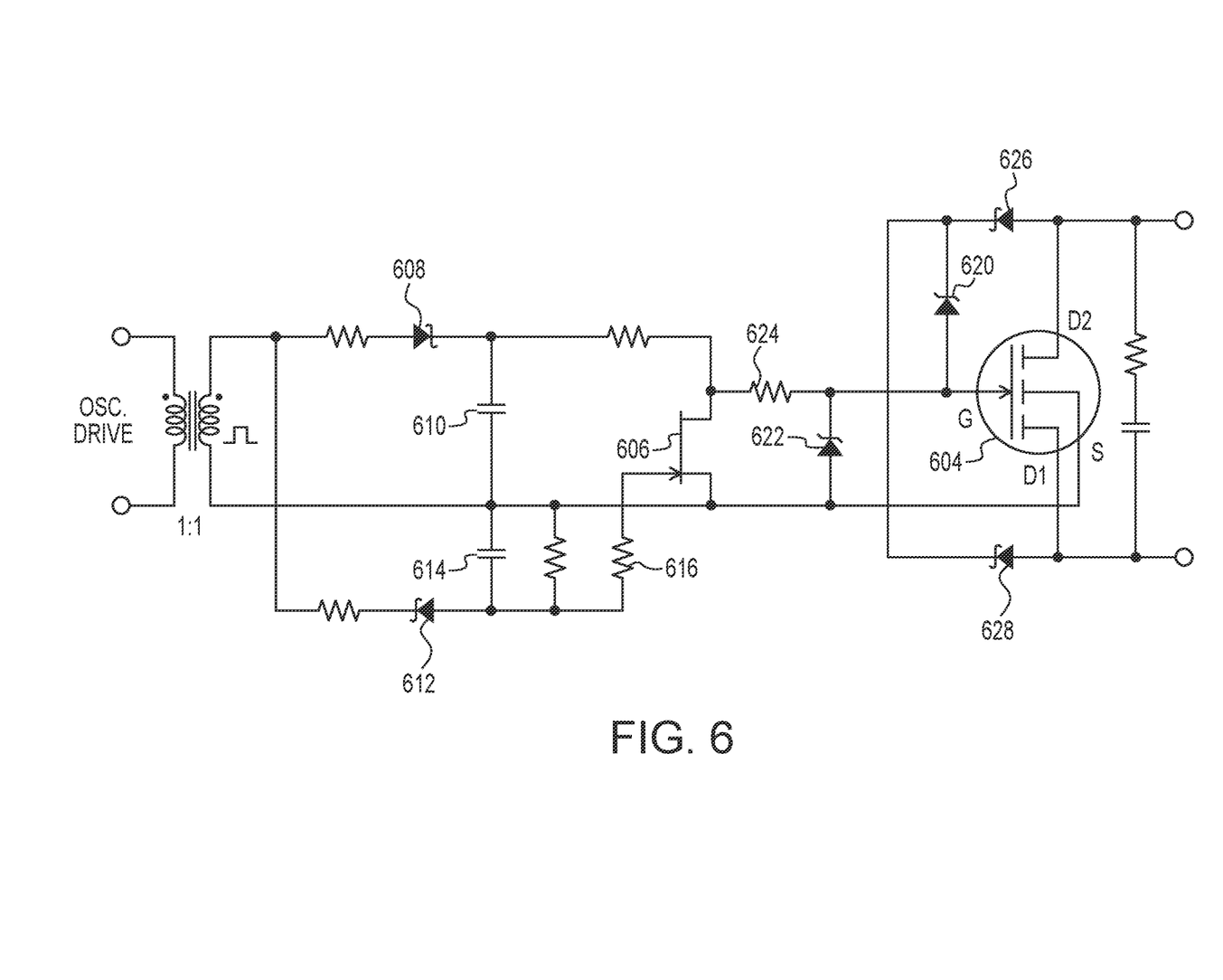
FIG. 6 is a circuit diagram of the driver circuit of FIG. 5, implemented with a bidirectional FET.
Figure 7:
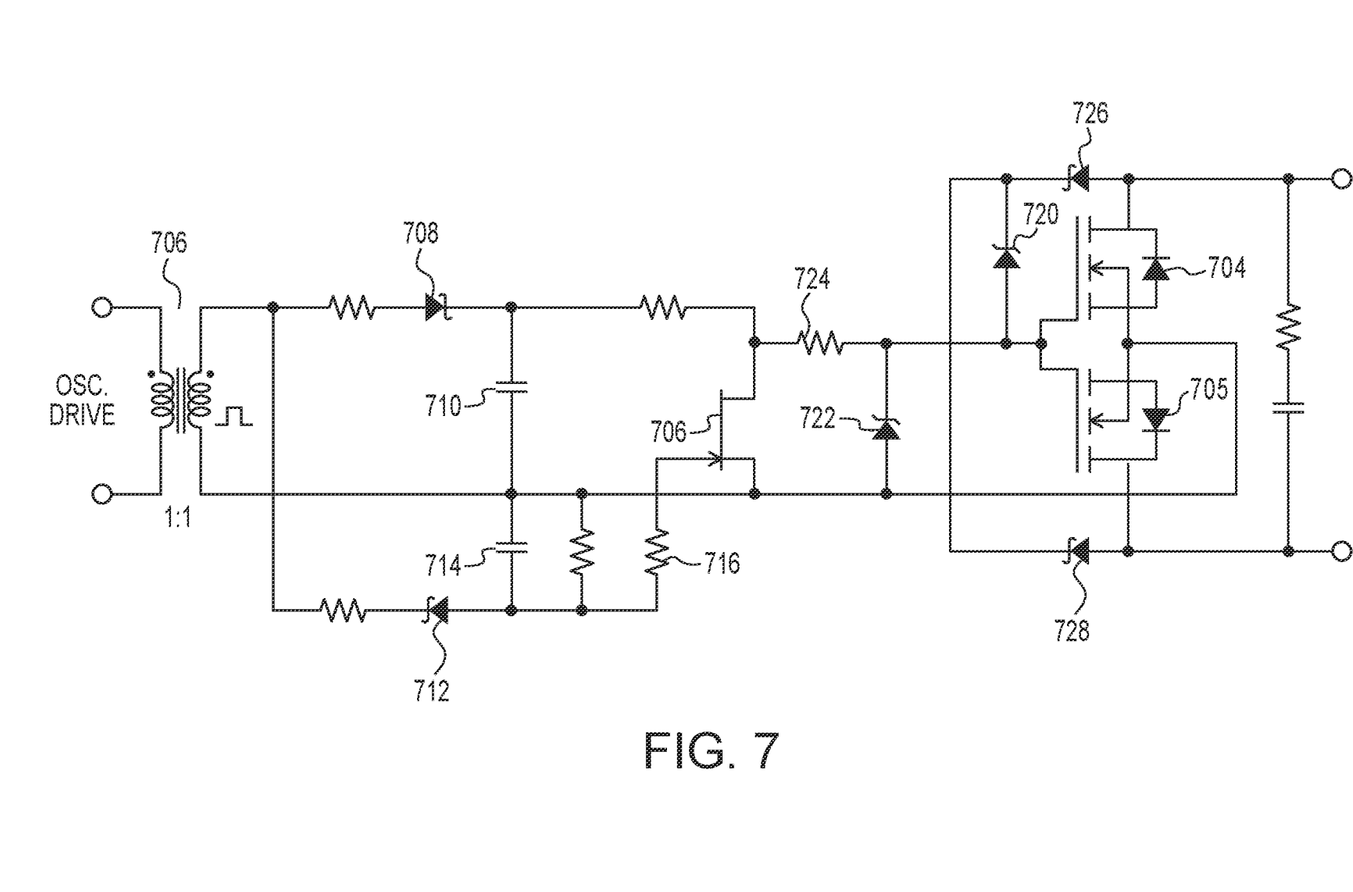
FIG. 7 is a circuit diagram of the driver circuit of FIG. 5, implemented with back-to-back FETs.

FIG. 5 is a block diagram of the gate driver of the present invention capable of AC operation. FIGS. 5 and 6 show the circuit implemented with a single bidirectional FET, preferably a GaN FET 504, 604. Alternatively, as shown in FIG. 7, the circuit can be implemented with discrete FETs (preferably GaN FETs 704, 705) connected back-to-back (common source and gate). The circuit of FIG. 5 includes over-voltage protection circuitry 520 to protect the drains of bidirectional GaN FET 504 (or the drains of discrete GaN FETs 704, 705) from overvoltage caused by load inductance during turn-off. Drain voltage is harvested to partially turn the FET back on to dissipate the inductive energy.

More specifically, in the operation of the overvoltage protection circuit in the driver circuit of FIG. 6 (bidirectional GaN FET), if the voltage at drains D1 or D2 exceeds the breakdown voltage of Zener diode 620 +2.5V (i.e., the gate plateau voltage for the FET to conduct), then the FET 604 is partially turned on. The breakdown voltage of Zener diode 620 is chosen based to not exceed the FET voltage rating and the desired clamp voltage. Zener diode 622 protects the connected gate of GaN FET 602 from over-voltage. Resistor 624 is used to prevent off-state override. Diodes 626 and 628 are used to allow bipolar voltage, and are not needed for a single FET, DC only, version. The overvoltage protection circuit in the driver circuit of FIG. 7 (dual back-to-back GaN FETs) operates similarly, where like reference numbers represent like circuit elements.

Figure 8:
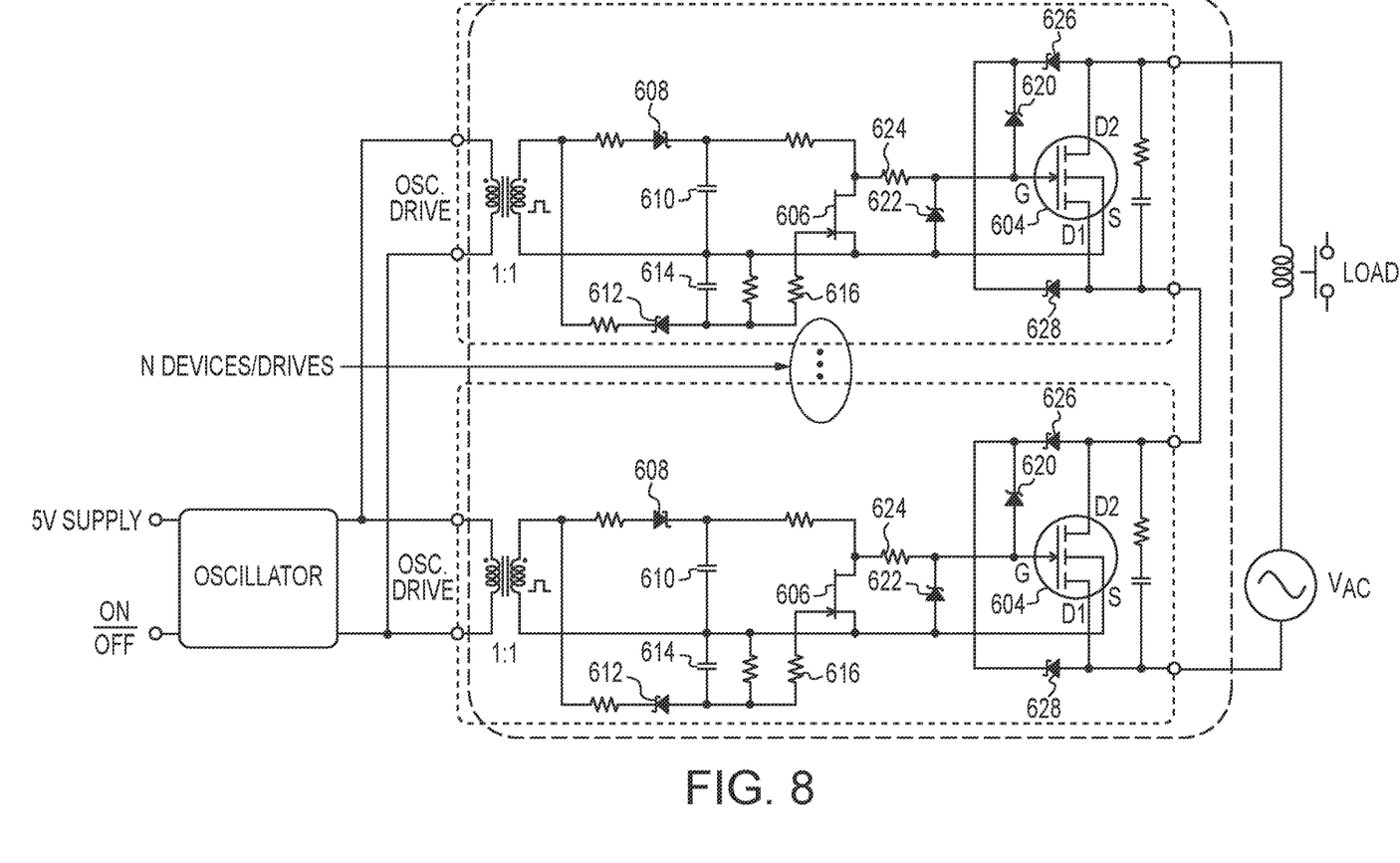
FIG. 8 is a circuit diagram of a cascaded embodiment of the driver circuit of FIG. 6.
Figure 9:
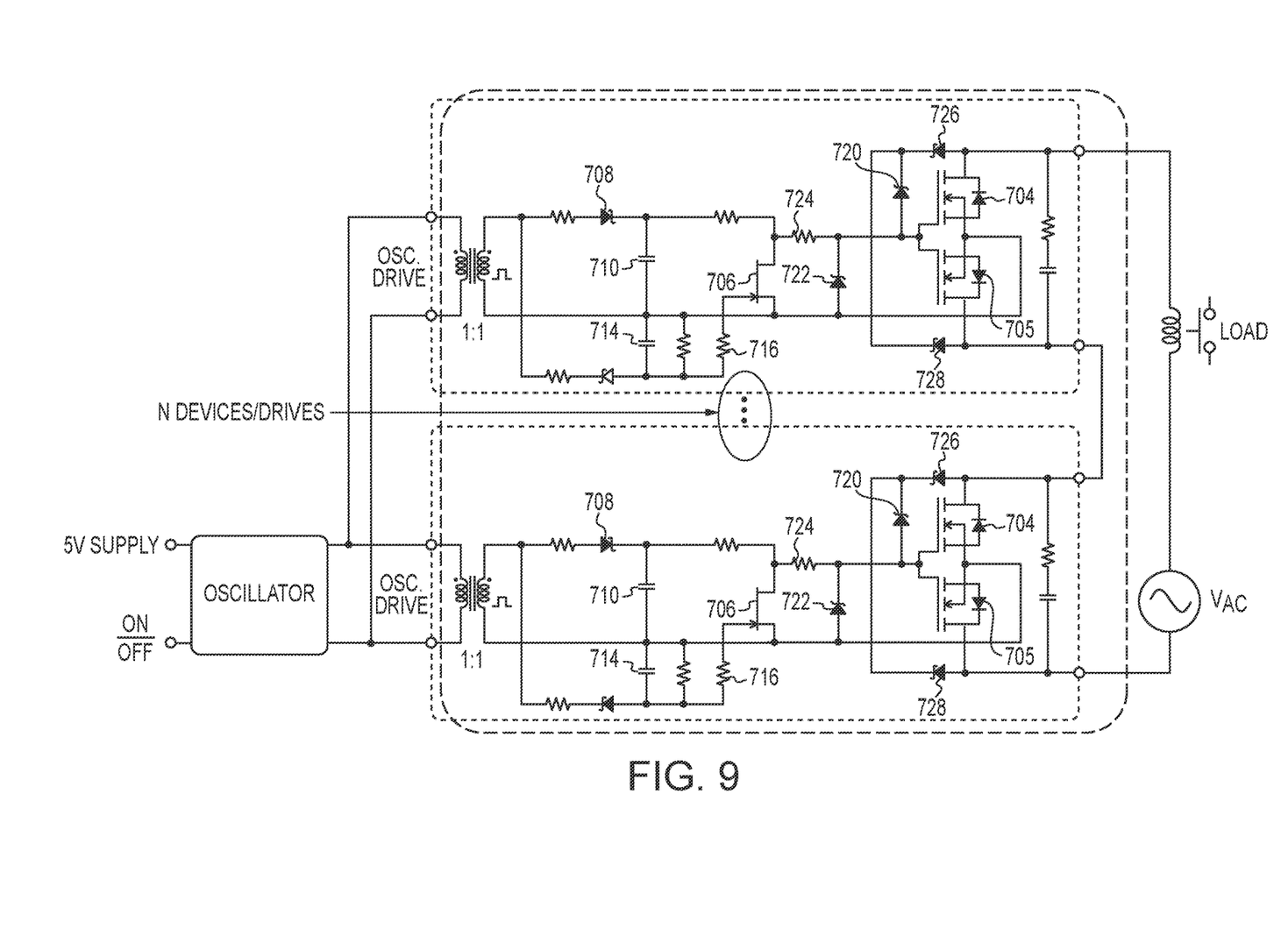
FIG. 9 is a circuit diagram of a cascaded embodiment of the driver circuit of FIG. 7.

Referring now to FIGS. 8 and 9, in another embodiment of the present invention, the SSR driver circuit is provided in a cascaded topology to increase the blocking voltage. In the cascaded embodiment, the power FETs in the cascaded gate driver circuits are connected in series. The transformer $T_1$ must have total isolation voltage capability. The transformers $T_1$ are connected in parallel on the primary side. When the oscillator is on, the 300 kHz square wave turns on the FETs/SSR; when the oscillator is off, the absence of the 300 kHz square wave turns off the FETs/SSR.

During a turn-off event, if one FET turns off quicker than other FETs, then the clamping circuit of the quicker FET will activate, allowing it to conduct current at a clamped voltage. The clamping voltage is held while the voltage of the other FETs increase, with successive turned off FETs also entering a clamping state until all the FETs have turned off.

Conversely, during a turn-on event, if one FET turns on quicker than other FETs, then the clamping circuits of the other FETs become activated, speeding up the turn on of the slower FETs. This continues until all the FETs in the cascaded circuit are in the on state and conducting.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A driver circuit for a solid state relay, comprising:
a main FET;
a depletion mode control transistor; and
a split power supply, wherein a positive supply of the split power supply provides a positive voltage applied to a gate of the main FET for supplying power to a load, and a negative supply of the split power supply provides a negative voltage for turning off the depletion mode control transistor, wherein the control transistor prevents the main FET from conducting power to the load when the driver circuit is turned off,
wherein the driver circuit further comprises a first capacitor, a second capacitor, a first diode, and a second diode, wherein the first diode is configured to positively charge the first capacitor in response to the positive voltage, and the second diode is configured to negatively charge the second capacitor, which turns off the depletion mode control transistor.

2. The driver circuit of claim 1, wherein the FET is a MOSFET.

3. The driver circuit of claim 1, wherein the FET is a GaN FET.

4. The driver circuit of claim 1, wherein the control transistor is a JFET.

5. The driver circuit of claim 1, wherein the control transistor is a depletion mode GaN FET.

6. The driver circuit of claim 1, wherein the FET comprises a dual back-to-back FET.

7. The driver circuit of claim 1, wherein the FET comprises a bidirectional FET.

8. The driver circuit of claim 1, wherein the driver circuit initiates the negative side first, prioritizing the turn off of the control transistor, thereby reducing turn-on current.

9. The driver circuit of claim 1, further comprising circuitry for controlling turn off in the event the FET switches an inductive load, wherein drain voltage is harvested to turn the FET on to dissipate the inductive energy.

10. A driver circuit for a solid state relay, comprising a plurality of driver circuits as recited in claim 1 driven by a single oscillator circuit, wherein the FETs of each of the driver circuits are connected in series.

11. A driver circuit for a solid state relay as recited in claim 10, comprising circuitry for clamping the voltage of the FET which is quicker than other FETs and turns off first, allowing the quicker FET to conduct current at the clamped voltage while the voltage of the other FETs increase, with successive turned-off FETs being voltage clamped until all FETs are turned off.

12. A driver circuit for a solid state relay as recited in claim 10, comprising circuitry for clamping the voltage of the FETs which is quicker to turn on, allowing the slower FETs to turn on sooner.

13. The driver circuit of claim 1, wherein said split power supply comprises a transformer having a split voltage configured to provide the voltage and the negative voltage.

14. The driver circuit of claim 1, wherein the control transistor ensures that the FET is off even absent any power at the split power supply.

15. The driver circuit of claim 1, wherein the voltage turns on the gate of the FET.

16. The driver circuit of claim 1, wherein the control transistor when on is configured to short circuit the voltage, and the negative voltage turns off the control transistor to remove any short circuit of the voltage and allow the voltage to turn on the FET.

17. The driver circuit of claim 1, wherein the control transistor when on is configured to provide a low impedance at the gate of the main FET, and the negative voltage turns off the control transistor to remove any low impedance at the gate of the main FET and allow the voltage to turn on the FET.

18. The driver circuit of claim 1, wherein the control transistor turns off the main FET, thereby eliminating the need for the negative voltage to be applied to the gate of the main FET to turn off the main FET.

19. The driver circuit of claim 1, wherein the negative voltage precedes the voltage.

20. The driver circuit of claim 1, wherein the first diode is parallel with the second diode, and the first capacitor is in series with the second capacitor between the first and second diodes.

* * * * *